United States Patent
Nezafat et al.

(10) Patent No.: US 7,285,954 B2
(45) Date of Patent: Oct. 23, 2007

(54) IMAGING AND RECONSTRUCTION OF PARTIAL FIELD OF VIEW IN PHASE CONTRAST MRI

(75) Inventors: Reza Nezafat, Newton, MA (US); Richard B. Thompson, Edmonton (CA); Elliot R. McVeigh, Phoenix, MD (US)

(73) Assignee: The United States of America as represented by the Secretary of the Department of Health and Human Services, Washington, DC (US)

( * ) Notice: Subject to any disclaimer, the term of this patent is extended or adjusted under 35 U.S.C. 154(b) by 0 days.

(21) Appl. No.: 11/227,406

(22) Filed: Sep. 14, 2005

(65) Prior Publication Data

US 2007/0057671 A1  Mar. 15, 2007

(51) Int. Cl.
G01V 3/00 (2006.01)
(52) U.S. Cl. .................... 324/309; 324/307
(58) Field of Classification Search ............ 324/309, 324/307, 318, 319, 322, 300; 600/410–424
See application file for complete search history.

(56) References Cited

U.S. PATENT DOCUMENTS

| | | | |
|---|---|---|---|
| 5,206,591 A * | 4/1993 | Hausmann et al. | 324/306 |
| 5,408,180 A * | 4/1995 | Mistretta et al. | 324/306 |
| 6,393,313 B1 * | 5/2002 | Foo | 600/410 |
| 6,487,435 B2 * | 11/2002 | Mistretta et al. | 600/420 |
| 6,630,828 B1 * | 10/2003 | Mistretta et al. | 324/309 |
| 6,954,067 B2 * | 10/2005 | Mistretta | 324/307 |
| 7,049,816 B2 * | 5/2006 | Mistretta et al. | 324/306 |
| 2003/0135103 A1 * | 7/2003 | Mistretta | 600/410 |

OTHER PUBLICATIONS

Demoulin et al : Magnetic Resonance Angiography; Magnetic Resonance Radiology vol. 161, pp. 717-720 (1986).*
J.A. Polzin, "A complex-difference phase-contrast technique for measurement of volume flow rates," J. Magn. Reson. Imaging 5:129-137 (1995).
D.C. Noll et al., "A homogeneity correction method for magnetic resonance imaging with time-varying gradients," IEEE Trans. Med. Imaging 10:629-637 (1991).
P. Irarrazabal, "Inhomogeneity correction using an estimated linear field map," Magn. Reson. Med. 35:278-282 (1996).
Y.M.A. Bernstein et al., "Comparison of phase-difference and complex-difference processing in phase-contrast MR angiography," J. Magn. Reson. Imaging 1:725-729 (1991).
E.M. Haacke et al. "Constrained reconstruction: a super resolution, optimal signal-to-noise alternative to the Fourier transform in magnetic resonance imaging," Med. Phys. 16:388-397 (1989).

(Continued)

*Primary Examiner*—Brij B. Shrivastav
(74) *Attorney, Agent, or Firm*—Klarquist Sparkman, LLP

(57) ABSTRACT

Phase contrast magnetic resonance images are produced using interleaved spiral k-space scanning with a bipolar phase contrast gradient. Spiral scanning is configured so that acquisition impulse response defines a central alias free portion in a partial field of view, and signal acquisition is arranged so that moving spins are contained with this central alias free portion. First and second signals are acquired with alternate phase encodings, and a complex difference of the acquired signals is obtained. The complex difference is substantially free of aliasing artifacts within the central portion.

23 Claims, 7 Drawing Sheets

OTHER PUBLICATIONS

D.C. Noll, "Homodyne detection in magnetic resonance imaging," IEEE Transactions on Medical Imaging 10:154-163 (1991).

J.R. MacFall et al. "Correction of spatially dependent phase shifts for partial Fourier imaging," Magn. Reson. Imaging 6:143-155 (1988).

M. F. Walker et al. "Quantitative flow measurement in phase contrast MR angiography," J. Comput. Assist. Tomogr. 12:304-313 (1988).

P.R. Moran, "A flow velocity zeugmatographic interlace for NMR imaging in humans," Magn. Reson. Imaging 1:197-203 (1982).

P.R. Moran, "Verification and evaluation of internal flow and motion true magnetic resonance imaging by the phase gradient modulation method," Radiology 154:433-441 (1985).

G.B. Pike et al., "Magnetic resonance velocity imaging using a fast spiral phase contrast sequence," Magn. Reson. Med. 32:476-483 (1994).

P.D. Gatehouse et al., "Real time blood flow imaging by spiral scan phase velocity mapping," Magn. Reson. Med. 31:504-512 (1994).

C.H. Meyer et al, "Fast spiral coronary artery imaging," Magn. Reson. Med. 28:202-213 (1992).

D.G. Nishimura et al., "A velocity k-space analysis of flow effects in echo-planar and spiral imaging," Magn. Reson. Med. 33:549-556 (1995).

J.R. Liao et al., "Cine spiral imaging," Magn. Reson. Med. 34:490-493 (1995).

G.L. Nayler et al., "Blood flow imaging by cine magnetic resonance," J. Comput. Assist. Tomogr. 10:715-722 (1986).

N.J. Pelc et al., "Phase contrast cine magnetic resonance imaging," Magn. Reson. 7:229-254 (1991).

J.B. Park et al., "Rapid measurement of time-averaged blood flow using ungated spiral phase-contrast," Mag. Res. Med. 49:322-328 (2003).

Park et al., "Rapid measure of renal artery blood flow with ungated spiral phase-contrast MRI," J. Magn. Res. Imaging 21:590-595 (May 2005).

K.S. Nayak et al., "Rapid quantitation of high-speed flow jets," Magn. Reson. Med. 50:366-372 (Aug. 2003).

W.R. Overall et al., "Fast phase-contrast velocity measurement in the steady state," Magn. Reson. Med. 48:890-898 (Nov. 2002).

L.C. Man, "Nonsubtractive spiral phase contrast velocity imaging," Magn. Reson. Med. 42:704-713 (Oct. 1999).

Burstein et al., "Factors in myocardial "Perfusion" imagin with ultrafast MRI and Gd-DTPA administration," Magn. Reson. Med. 20:299-305 (1991).

Park et al., "Rapid Cardiac-output measurement with ungated spiral phase contrast," Magn. Reson. Med. 56:432-438 (2006).

G. McGibney et al., "Quantitative evaluation of several partial Fourier reconstruction algorithms used in MRI," Magn. Reson. Med. 30:51-59 (1993).

R. B. Thompson et al., "Real-time volumetric flow measurements with complex-difference MRI," Magn. Res. Med. 50:1248-1255 (2003).

H. Sedarat et al., "Partial-FOV reconstruction in dynamic spiral imaging," Magn. Reson. Med. 43:429-439 (2000).

* cited by examiner

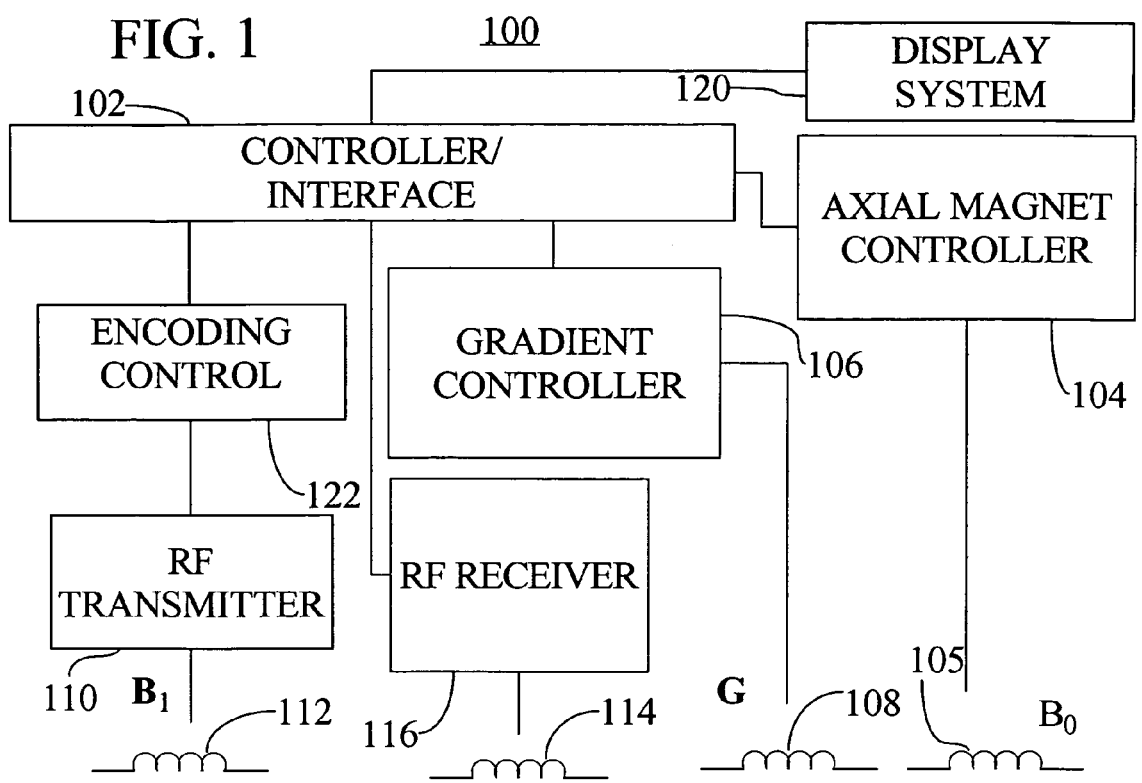

FIG. 6A   FIG. 6B   FIG. 6C   FIG. 6D
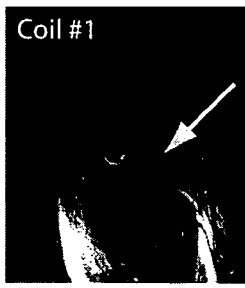 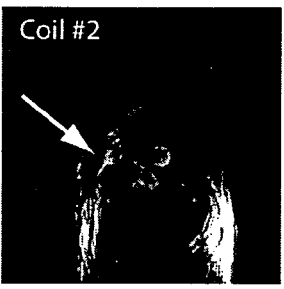 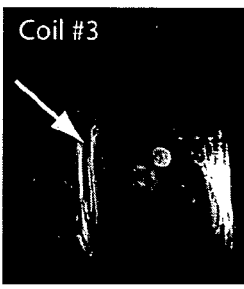 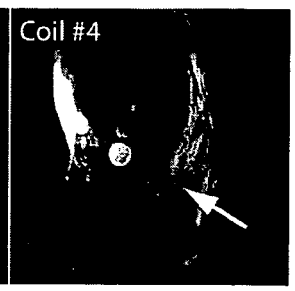
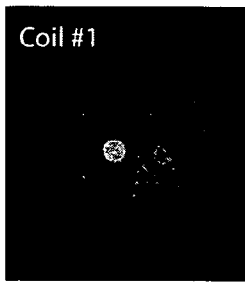 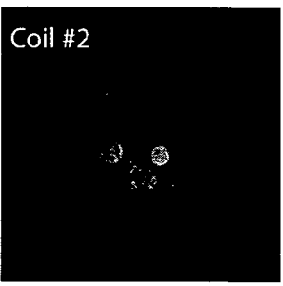 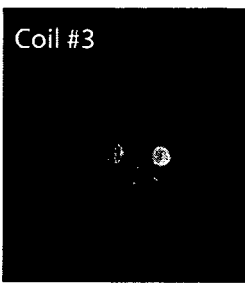 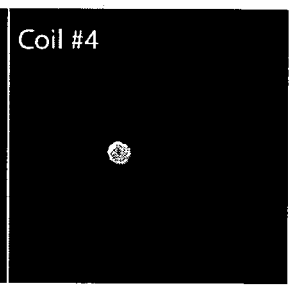
FIG. 7A   FIG. 7B   FIG. 7C   FIG. 7D

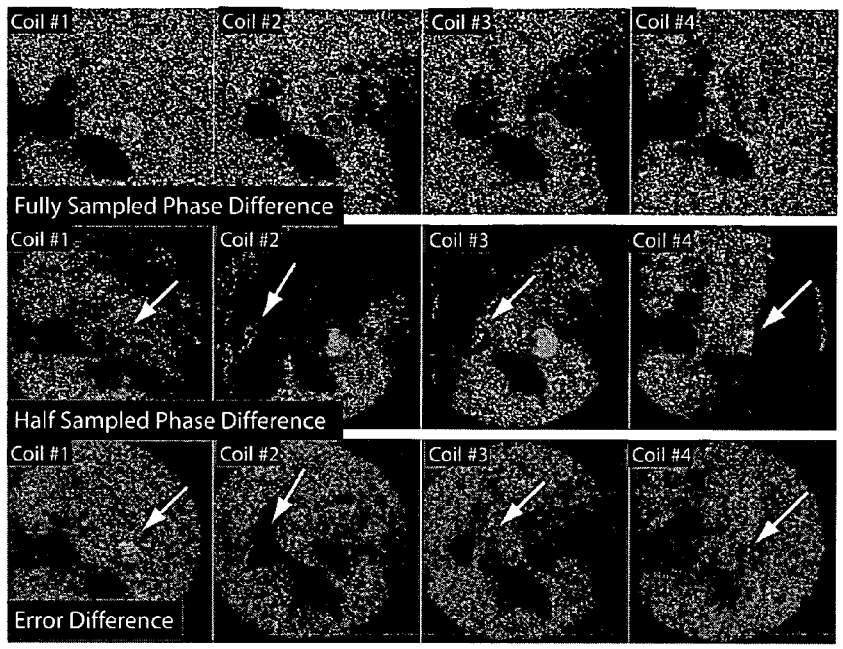
FIGS. 8A-8D
FIGS. 9A-9D
FIGS. 10A-10D
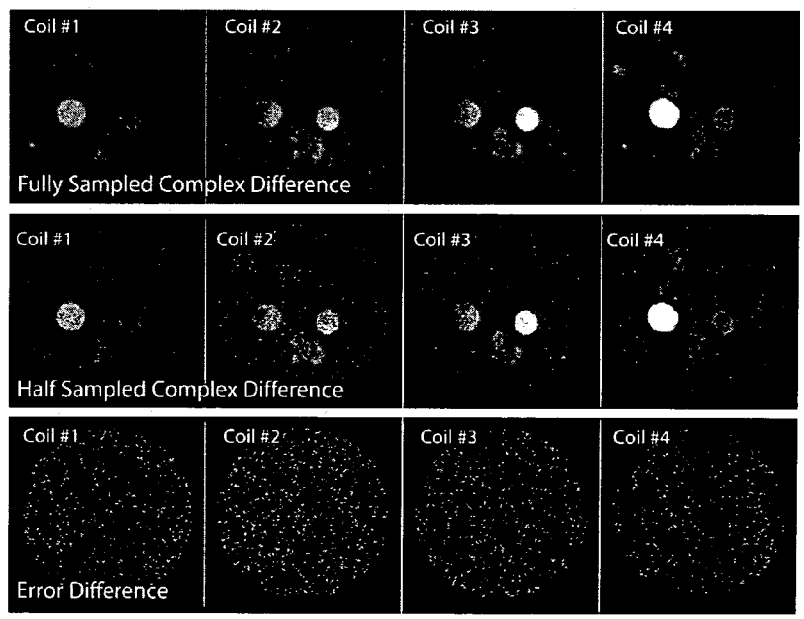
FIGS. 11A-11D
FIGS. 12A-12D
FIGS. 13A-13D FIG. 14A    FIG. 14B
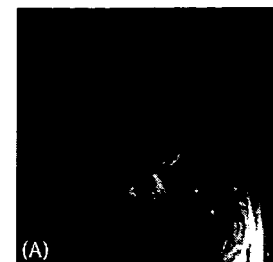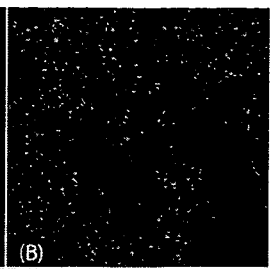
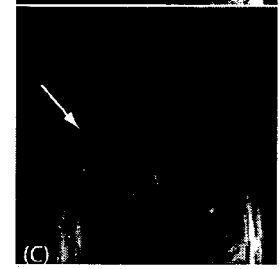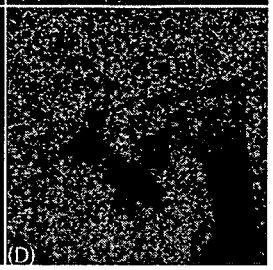
FIG. 14C    FIG. 14D
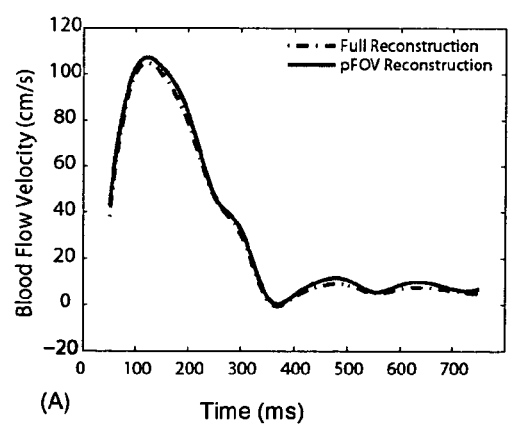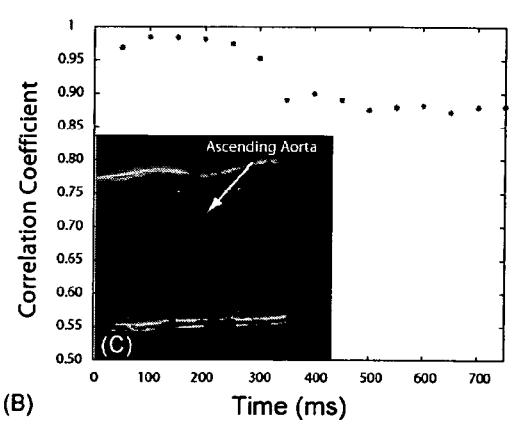
FIG. 15A    FIG. 15B

IMAGING AND RECONSTRUCTION OF PARTIAL FIELD OF VIEW IN PHASE CONTRAST MRI

TECHNICAL FIELD

The disclosure pertains to magnetic resonance imaging method and apparatus.

BACKGROUND

Magnetic resonance imaging (MRI) methods have been developed for industrial, medical, and research applications. These methods are based on situating a specimen in a strong static magnetic field ($B_0$), and magnetically manipulating and interrogating nuclear spins. Detected signals can be based on, for example, rotating spins that are aligned with $B_0$ to have spins that are perpendicular to $B_0$, and then detecting the return of the spins into alignment with $B_0$. In other examples, various radio-frequency (RF) pulses and pulse sequences are used to prepare the spins for interrogation. Such sequences can be used to produce spin echoes, stimulated echoes, gradient echoes and to detect the motion of spins. Typically a series of pulses and pulse sequences are applied so that an image can be obtained based on a series of planar sections or "slices."

In most MR image acquisitions, a gradient magnetic field G is applied so that the Larmor frequency ω of sample spins is spatially varying as $$\omega(\vec{r}) = \gamma B_0 + \gamma \vec{G} \cdot \vec{r}.$$

Total signal amplitude S(t) can then be written as in the form of a Fourier transformation such that $$S(t) = \int\int\int \rho(r) \exp[i\gamma \vec{G} \cdot \vec{r} \, t] dr.$$

For convenience, this signal amplitude is commonly expressed in terms of a reciprocal space vector $\vec{k} = (2\pi)^{-1} \gamma \vec{G} t$. Using this reciprocal space vector, the signal amplitude S(t) is the Fourier transform of the spin density ρ(r):

$$S(k) = \int\int\int \rho(r) \exp[i 2\pi \vec{k} \cdot \vec{r}] dr.$$

Thus, obtaining an estimate of the desired signal ρ(r) requires acquiring signals associated with a variety of k values or "sampling" of k-space.

In so-called "phase contrast" MRI, spin motion can be measured non-invasively. Phase contrast MR uses the first gradient moment of bipolar gradients to encode the motion of the nuclear spins into the phase of the magnetization, and ultimately, into image phase. To eliminate the non-motion related phase variations from radiofrequency receiver coils, two images are acquired with different first gradient moments. The phase difference between the two acquired images is proportional to the velocity of the spins in the imaged object. Phase contrast MRI can be used to, for example, image blood flow in vivo, or in other applications in which spin motion in a specimen is of interest. Unfortunately, such phase contrast MRI requires acquisition of two images, and therefore total signal acquisition time is twice that required in anatomical imaging which can limit the spatial or temporal resolution of acquired images. Accordingly, improved methods and apparatus for acquisition of images and data for phase contrast MRI are needed.

SUMMARY

Undersampled phase contrast MRI imaging methods comprise obtaining two undersampled magnetic resonance images with different first moment encoding values and calculating the phase difference or complex difference between the two. The first MR image and the second MR image are subtracted to produce a MR difference signal. In some examples, the first MR signal, the second MR signal, and the MR difference signal are image signals. In other examples, first and second undersampled scans are selected to produce an unaliased area in the first and second image signals corresponding to the selected portion of the field of view. In a representative example, the estimated spin flow rate is associated with cardiac blood flow. In other representative examples, the partial field of view is selected to be about one-half a full field of view, wherein the first and second images are acquired with an undersampling factor of two. In additional examples, the first and second MR images are based on applying a first bipolar gradient and a second bipolar gradient, wherein the second bipolar gradient is applied with a predetermined delay. In other examples, the undersampled scans are associated with spiral k-space scanning.

Methods of visualizing moving spins include obtaining first and second flow-encoded MR signals that are undersampled in k-space, and subtracting the first and second flow-encoded MR signals to obtain a complex difference signal. In some examples, portions of the image associated with moving spins are identified and a moving spin velocity associated with at least one portion of the image is estimated.

Magnetic resonance imaging (MRI) methods include obtaining at least first and second undersampled images that include contributions from moving spins, and forming an image with reduced aliasing based on a difference of the first and second undersampled images. [MJ2] In representative examples, an undersampling extent is selected based on a selected partial field of view. In a representative example, the undersampling extent is a factor of two, but can be higher or lower depending on the geometry of the specimen and location of the moving spins in the specimen under investigation. In other examples, computer readable media contain computer-executable instructions for such methods.

MRI apparatus comprise a receiver configured to detect at least a first and a second magnetic resonance (MR) signals and a processor configured to produce an image based on a difference of the first and second MR signals. A gradient controller is configured to phase encode a region of interest and provide a k-space trajectory selected so that the first and second MR signals are undersampled. A display is configured to produce an image based on the difference of the first and second MR signals. According to representative examples, the controller is configured to receive an input value associated with a size of a partial field of view. In other examples, the controller is configured to receive an input associated with an undersampling extent. In further representative examples, the gradient controller is configured to produce interleaved spiral k-space scans, wherein the first and second MR signals are associated with a selected spiral k-space scan.

Magnetic resonance (MR) signal processors include an input configured to receive a first MR signal and a second MR signal, wherein the first and second MR signals are undersampled phase contrast signals. A signal subtractor is configured to obtain a difference signal based on a difference of the first and second MR signals. In some examples, an output is configured to couple the difference signal to an image display. In additional examples, an output is configured to indicate a spin velocity associated with at least a portion of the displayed image.

These and other aspects and features of the disclosed technology are set forth below with reference to the accompanying drawings.

BRIEF DESCRIPTION OF THE DRAWINGS

FIG. 1 is a schematic diagram of a magnetic resonance imaging system.

FIGS. 6A-7D illustrate complex difference reconstruction of a partially sampled k-space reconstruction for four different coils. The images of FIG. 6A-6D are magnitude reconstructions using only half of the required k-space for a fully sampled k-space image. Only even spiral interleaves were used to reconstruct the data. FIGS. 7A-7D are corresponding flow weighted images reconstructed using the same data without flow calibration. The arrows in FIGS. 6A-6D point to significant aliasing artifacts that originated from undersampling and that are substantially removed in the complex difference reconstructions of FIGS. 7A-7D.

FIGS. 8A-10D illustrate complex difference image reconstruction from a fully-sampled acquisition (FIGS. 8A-8D), a half-sampled acquisition (FIGS. 9A-9D) and the difference between the two (FIGS. 10A-10D). There is an increase in the noise level by undersampling by a factor of two which is the direct consequence of undersampling, but no aliasing artifacts are observed in the difference images of FIGS. 10A-10D. For more convenient visualization, the complex difference images are not calibrated to quantify flow rates.

FIGS. 11A-13D illustrate complex difference image reconstruction from a fully-sampled acquisition (FIGS. 11A-11D), a half-sampled acquisition (FIGS. 12A-12D), and the difference between the two (FIGS. 13A-13D). There is an increase in the noise level by undersampling by a factor of two which is the direct consequence of the undersampling, however aliasing artifacts in the images are not observed in the images of FIGS. 13A-13D. For convenient visualization, the complex difference images are not calibrated to quantify flow rates.

FIGS. 14A-14D illustrate a comparison of flow measurements based on fully or half sampled k-space from a single coil. FIG. 14A is a magnitude image corresponding to fully sampled k-space. FIG. 14B illustrates complex difference processing of fully sampled k-space. FIG. 14C is a magnitude image based on acquisition of only half of k-space and FIG. 14D is a corresponding flow image. Arrows shows aliasing artifacts in the vessel.

FIG. 15A is a graph of blood flow velocity through the ascending aorta based on a partial and a full k-space acquisition.

FIG. 15B is a graph of a spatial cross-correlation coefficient of voxels within the ROI reconstructed by both technique over multiple cardiac phases. The inset is an axial image that serves as a basis for calculation of cross-correlation.

DETAILED DESCRIPTION

Figure 2A:
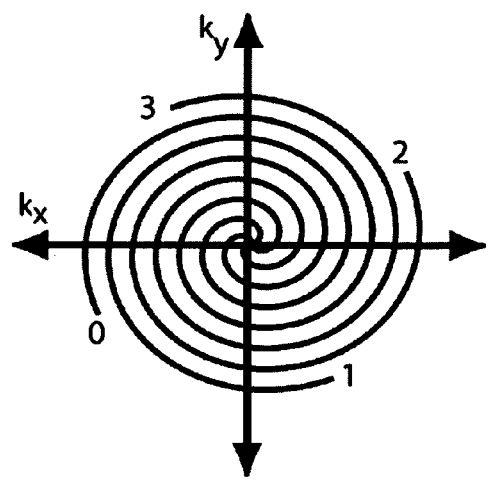
FIGS. 2A-2B are schematic diagrams illustrating a fully sampled spiral k-space trajectory and an associated point spread function, respectively.
Figure 2B:
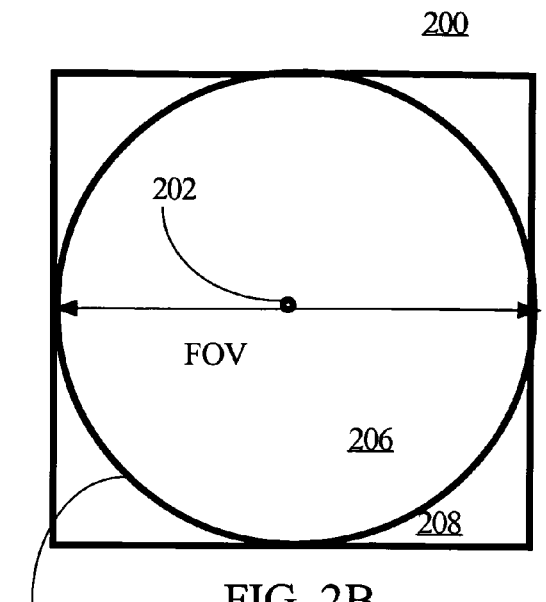

As used in this application and in the claims, the singular forms "a," "an," and "the" include the plural forms unless the context clearly dictates otherwise. Additionally, the term "includes" means "comprises." While particular examples and applications for the disclosed embodiments are also disclosed, the described systems, methods, and apparatus should not be construed as limiting in any way. Instead, the present disclosure is directed toward all novel and nonobvious features, aspects, and equivalents of the various disclosed embodiments, alone and in various combinations and sub-combinations with one another. The disclosed systems, methods, and apparatus are not limited to any specific aspect, feature, or combination thereof, nor do the disclosed systems, methods, and apparatus require that any one or more specific advantages be present or problems be solved. In addition, the attached figures may not show the various ways in which the disclosed systems, methods, and apparatus can be used in conjunction with other systems, methods, and apparatus, and components that are well known in the art are not described in detail.

Magnetic resonance (MR) images of moving spins can be obtained using a phase-contrast MR method by encoding spin motion in the phase of the MR signal. In order to obtain images more rapidly than with conventional methods, a partial field of view (pFOV) technique can be applied using spiral sampling and complex difference analysis. This technique can provide superior temporal resolution and is particularly advantageous in applications in which moving spins are substantially confined to a portion of field of view. Typically moving spins are confined to a central half of a circular field of view. As more fully described below, in some examples, phantom images and in-vivo images of the ascending aorta are obtained using such methods and can be compared with conventional, fully sampled acquisitions. While the illustrated spiral scans are convenient, partial image acquisition based on k-space undersampling can be based on other sampling methods such as, for example, radial imaging for a single projection or Cartesian k-space sampling.

A representative magnetic resonance imaging (MRI) apparatus 100 that is configured to perform partial field of view (pFOV), complex difference phase contrast (PC) imaging is illustrated in FIG. 1. The MRI system 100 includes a controller 102 that is typically programmed by a clinician with a series of commands corresponding to a particular imaging sequence. The command sequences can be entered with a keyboard, or a pointing device such as a mouse, or other input device. Command sequences can be stored by the controller 102 for retrieval from a hard disk, floppy disk, or other computer readable media, and can be selected from a menu, so that a clinician can easily select among an imaging protocol from various command sequences. Alternatively, command sequences or other operational information can be remotely stored and retrieved via a network connection from remote storage from, for example, a remote server.

The MRI apparatus 100 includes an axial magnet controller 104 that controls the spatial homogeneity of an axial magnetic field $B_0$ with an axial field coil 105. For convenience, the axial magnetic field $B_0$ can be assigned so as to be directed along a +z-axis in a xyz coordinate system. A plane parallel to an xy-plane (perpendicular to the z-axis) is referred to as a transverse plane. A gradient controller 106 activates one or more gradient coils 108 to produce a magnetic field gradient G that is typically applied as a pulse. The gradient coils 108 can consist of one or more coils or subcoils that are configured to apply particular components (such as x, y, or z-components) of the gradient field G.

A radio-frequency (RF) transmitter 110 is configured to generate RF pulses that are applied to a transmitter coil 112 to produce an RF magnetic field $B_1$. A receiver coil 114 detects changes in magnetization in the specimen and communicates the detected magnetization changes to an RF receiver 116. The RF receiver 116 processes the detected magnetization changes and provides corresponding electrical signals or image data to the controller 102 based on these changes. The particular arrangement of FIG. 1 is selected for convenience, and components of such an MRI apparatus can be arranged in other ways.

A specimen to be imaged is exposed to the axial magnetic field $B_0$, one or more field gradients G, and one or more radiofrequency fields $B_1$ that are selected by the controller 102. Changes in specimen magnetization are detected by the receiver coil 114 and processed by the RF receiver 116. The field gradient G exposes the specimen to a non-uniform magnetic field, so that slices of the specimen can be selected for imaging. Within a selected slice, the resonance frequency $\omega_{RF}$ is sufficiently constant so that the RF receiver 116 can reject magnetization changes in non-selected slices by rejecting frequency components corresponding to the non-selected slices. Detecting changes in magnetization slice by slice permits image formation.

The controller can be configured to provide selected spin encodings such as a bipolar phase encoding and to provide a selected k-space sampling and scanning sequence. Such encodings and scanning sequences are typically based on technician inputs using a controller interface such as a graphical user interface, a command line interface, or by execution of one or more computer-executable scripts written in a general purpose programming language or based on a dedicated MR imaging command and control instruction set. Not only can sequences be configured in this manner, but the controller or other portion of the MR system can be arranged to provide alarms or other visual or audible indications to the technician concerning specimen placement, initiation of acquisition, or to indicate image portions that may be associated with image artifacts or other image limitations associated with a selected imaging sequence.

Spiral scanning of k-space can be produced with, for example, a pair of increasing sinusoidal gradients applied along orthogonal axes. Such gradients generally do not require gradient switching bandwidths associated with k-space scanning in which gradients are rapidly switched on and off. In some examples of spiral scanning, k-space is scanned with a constant angular velocity, and an appropriate gradient strength can be difficult to achieve for large values of k. Spiral scanning can also be based on constant linear velocity in k-space so that such large gradients are unnecessary, or other scan configurations can be used. Image reconstruction can be based on the spiral scan by, for example, interpolating the spiral scan data to obtain a rectangular grid that is appropriate for processing by, for example, a fast Fourier transform. Other k-space trajectories can also be used, including Cartesian trajectories and radial k-space trajectories such as those associated with projection reconstructions.

Because the spin density or other specimen-based property that is to be obtained by MRI is based on a Fourier transform of signals acquired in so-called k-space, such sampling can be variously configured in association with specimen properties to facilitate identification of particular specimen features, or to select a convenient image acquisition time or rate. While limited k-space sampling is associated with reduced image acquisition times, MR images acquired with such sampling tend to exhibit defects that limit the usefulness of more rapid acquisition. For example, by limiting k-space acquisition so that data for only a portion of k-space is acquired, aliasing artifacts can be produced that generally depend on the particular k-space trajectory. For spiral k-space scanning, such aliasing typically is generally associated with all image pixels/voxels. However, as described below, spiral scanning in combination with post-acquisition image processing can be configured to provide both reduced image acquisition times and images substantially free of aliasing artifacts. An example application to imaging of flowing spins associated with blood flow is described. This application is selected for convenient explanation, and the disclosed methods and apparatus can be used in other applications as well.

FIGS. 2A-3A illustrate a fully sampled spiral k-space trajectory and a half-sampled (two times undersampled) spiral k-space trajectory, respectively. Even and odd interleaves can be obtained in alternate cardiac cycles for cardiac magnetic resonance imaging. Spatial point spread functions (PSFs) 200, 300 associated with the k-space trajectories of FIGS. 2A-3A are illustrated in FIGS. 2B-3B, respectively. The PSFs 200, 300 include respective central impulse-like response portions 202, 302 and circular rings 204, 304. Interior regions 206, 306 within the rings 204, 304 are alias free. However, because a diameter of the circular ring 304 is one-half the FOV, specimen signals associated with portions in the exterior region 308 are aliased into the image, including image portions associated with the central region 306. For fully sampled image acquisition (FIGS. 2A-2B), the entire field of view is substantially alias free, while for undersampled image acquisition (FIG. 3A-3B), only a central portion (a partial FOV) is alias free. Thus, images acquired using the k-space trajectory of FIG. 3A can include aliasing artifacts. However, as described below, any such aliasing artifacts can be removed or reduced in partial FOV, phase-contrast MRI.

For convenience herein, magnetic resonance signals and image signals are referred to as "undersampled" if associated with k-space samples that are undersampled with respect to a field of view. An undersampling extent is a factor by which k-space is undersampled and can be associated with an alias free partial field of view as shown in the PSFs above. An undersampling extent can be 2×, 3× or some other factor and such undersampling is typically associated with partial fields of view that are, for example, ½, ⅓ or other fraction of a field of view. Integer and non-integer values of undersampling extent can be used.

Figure 3A:
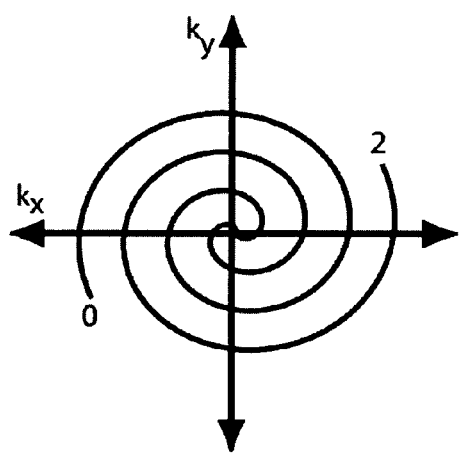
FIGS. 3A-3B are schematic diagrams illustrated a half-sampled spiral k-space trajectory and an associated point spread function, respectively. Even k-space interleaves are shown. Odd interleaves are used in alternate cardiac cycles.
Figure 3B:
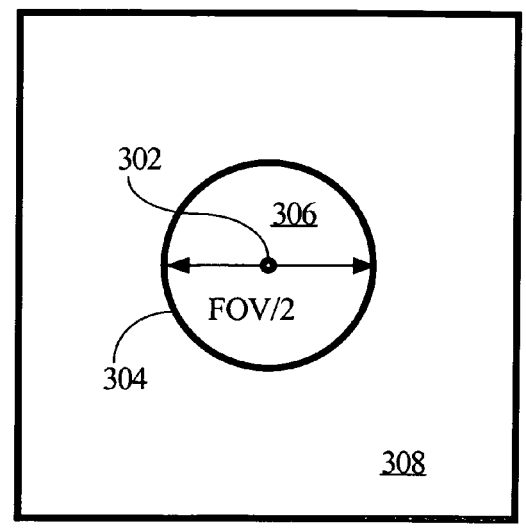

Using the k-space trajectory of FIG. 3A in blood flow imaging, acquired MR signals include contributions from moving and non-moving spins in both the regions 306, 308. However, the MR signals from the non-moving spins are the same in different bipolar signal acquisitions, while signals associated with moving spins change in response to such encoding. Aliasing contributions associated with the exterior region 308 are substantially constant, and can be removed by signal subtraction. Thus, imaging parameters can be configured so that all moving spins are associated with the interior region 306 so that aliasing produced by undersampling can be substantially eliminated or reduced by signal subtraction.

A complex MR signal acquired from a selected slice can be expressed as:

$$S(t) = \int\int \kappa(x,y) M(x,y) \exp[i\theta(x,y)] dx dy,$$

wherein $\kappa(x,y)$ is coil sensitivity, $M(x,y)$ is the excited transverse magnetization weighted by imaging parameters such as TR, TE, and a spin relaxation parameter $\theta(x,y)$ is associated with an accumulated phase of the transverse magnetization. The accumulated phase $\theta(x,y)$ can be expressed as a sum of a background phase $\Phi_b$ based on, for example, the configuration of RF coils and off-resonance, unbalanced phases due to eddy currents and a velocity-encoded phase $\Phi_v$. Thus, $$\theta(x,y) = \Phi_b + \Phi_v = \Phi_b + \gamma M_1 v_z(x,y),$$

wherein $M_1$ is a first encoded moment, $\gamma$ is the gyromagnetic ratio, and $v_z(x,y)$ is a z-component of spin velocity. The complex MR signal $S(t)$ can then be expressed as a sum of portions associated with the outer region dynamic magnetization, outer region static magnetization, inner region dynamic magnetization, and inner region dynamic magnetization $S_{(or,d)}$, $S_{(or,s)}$, $S_{(ir,d)}$, $S_{(ir,s)}$ respectively:

$$S(t) = S_{(or,d)} + S_{(or,s)} + S_{(ir,d)} + S_{(ir,s)}.$$

By configuring all or substantially all moving spins to be situated in the inner region, the signal portion $S_{(or,d)}$ can be neglected. Undersampling by a factor of two as shown in FIG. 3A still produces aliasing of $S_{(or,s)}$ into the image, but signals associated with this signal portion can be removed by signal subtraction. A complex difference signal $\Delta S(t)$ can be expressed as:

$$\Delta S(t) = S_{(or,s)}^2 + S_{(ir,d)}^2 + S_{(ir,s)}^2 - (S_{(or,s)}^1 + S_{(ir,d)}^1 + S_{(ir,s)}^1) = S_{(ir,d)}^2 - S_{(ir,d)}^1,$$

wherein superscripts 2, 1 denote signals acquired with first and second phase encodings, respectively. The complex difference signal is based only on dynamic magnetization, and contributions associated with aliasing from the outer region are absent.

Based on the complex difference signal, the image domain complex MR signal for each voxel $\Delta S(x,y)$ can be expressed as:

$$\Delta S(x,y) = \kappa(x,y) M(x,y) (e^{i\theta_2(x,y)} - e^{i\theta_1(x,y)}),$$

wherein $\theta_2(x,y)$, $\theta_1(x,y)$ are transverse magnetization phases associated with two bipolar phase contrast encodings. This signal expression can be rewritten in terms of a velocity encoding strength $V_{enc}$ so that $$\Delta S(x,y) = \kappa(x,y) M(x,y) e^{i\varphi_b(x,y)} \left[ 2i \sin\left( \frac{\pi v_z(x,y)}{2 V_{enc}} \right) \right].$$

A spin velocity map can then be expressed as:

$$v_z(x,y) = \frac{2 V_{enc}}{\pi} \arcsin\left[ \frac{\Delta s(x,y)}{|\kappa(x,y) M(x,y) e^{i\varphi_b(x,y)}|} \right].$$

Thus, spin velocities and associated images can be obtained based on a complex difference of undersampled signals using spiral k-space trajectories with aliasing effects associated with undersampling reduced or eliminated.

To calculate the velocity map $v_z(x, y)$, an aliased free image $\kappa(x,y) M(x,y) e^{i\Phi_b(x,y)}$ is needed. In one example, calibration can be established based on a fully sampled image reconstructed with consecutive cardiac phases. This image can be reconstructed adaptively from the imaging data set by an acquisition scheme previously proposed by Sedarat et al., "Partial-FOV reconstruction in dynamic spiral imaging," Magn. Reson. Med. 43:429-439 (2000). The spiral interleaves for reconstruction of an image with a given resolution are grouped into even or odd groups, and each groups is acquired in different cardiac phases. By combining the data from consecutive cardiac phases, a fully sampled image can be reconstructed that can be used for extraction of the calibration image. The sign of the phase contrast image reconstructed from this image is used to determine the direction of the flow in the complex difference processing.

Figure 4:
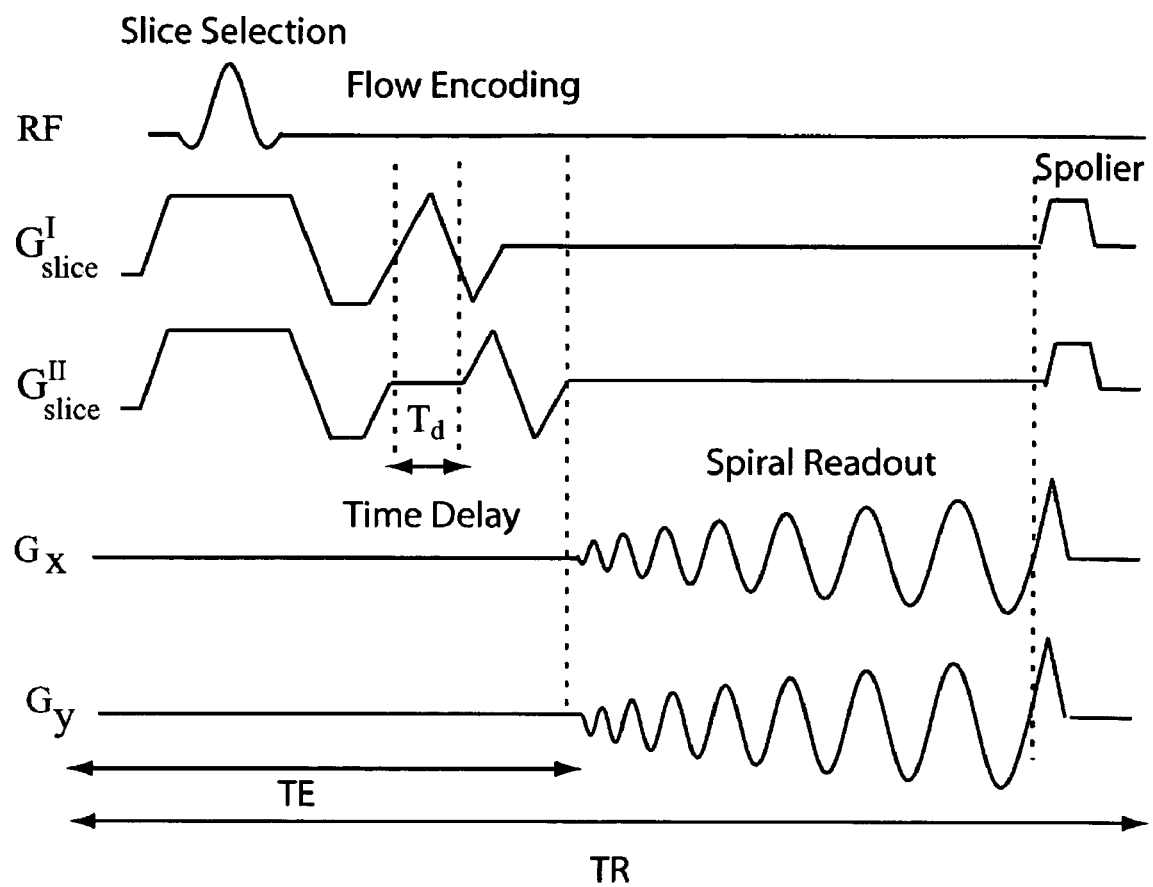
FIG. 4 is a diagram illustrated a representative pulse sequence for acquisition of half-sampled phase contrast data using a time delayed bipolar phase encoding gradient.

A representative spiral phase contrast pulse sequence is illustrated in FIG. 4. A time shifted bipolar gradient sequence that provides flow encoding is applied after a slice rephasing gradient. The encoding sequence comprises a first gradient portion and a second gradient portion that are substantially the same but time shifted by a delay $T_d$ to provide balanced flow-encoding with equal and opposite first moments $\pm M_{1z}$. Such a time-shifted bipolar gradient can reduce phase differences associated with, for example, eddy currents that can be produced with bipolar gradients associated with different amplitudes. See, for example, Thompson and McVeigh, "Real-time volumetric flow measurements with complex-difference MRI," Magn. Reson. Med. 50:1248-1255 (2003). The delay between the gradient portions can provide balanced first moment $\pm M_{1z}$ in two encoding steps and can be determined by the slice selective gradient area and the desired velocity encoding $V_{enc}$.

Figure 5:
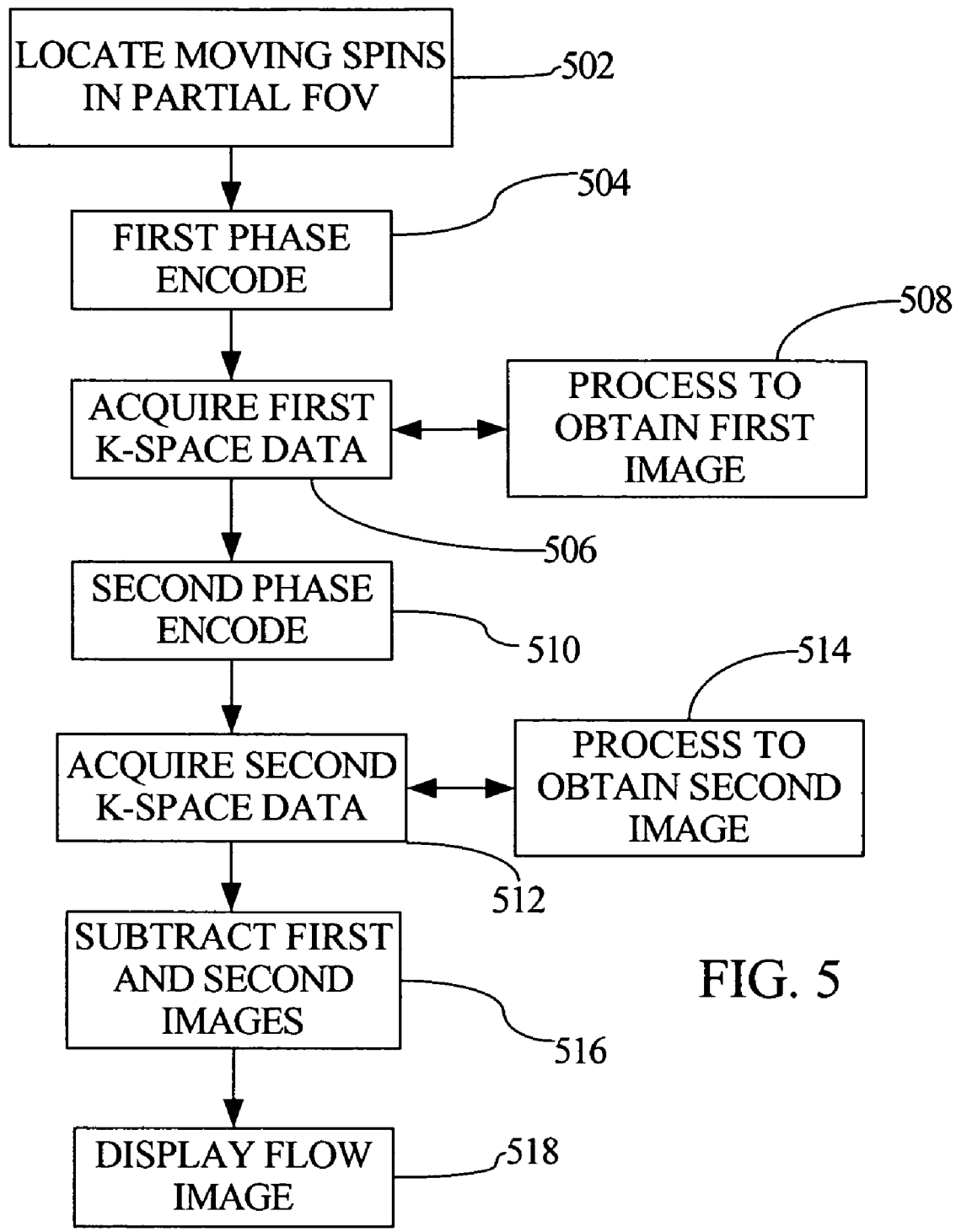
FIG. 5 is a block diagram of an image reconstruction method based on a complex difference of first and second undersampled phase encoded data sets.

A representative partial field of view (pFOV), phase-contrast functional imaging method is illustrated in FIG. 5. In a step 502, moving spins are situated within a pFOV that is substantially free of aliasing artifacts associated with a selected undersampled k-space data acquisition. In a step 504, a first phase encoding is applied and in a step 506 an associated first MR signal is acquired. The first MR signal is processed in a step 508 to produce a first MR image. A second phase encoding is applied in a step 510, a second MR image is acquired in a step 512, and a second MR image is produced in a step 514. The first and second images are subtracted in a step 516 to produce a complex difference, and an image based on the complex difference is displayed in a step 518.

Fully sampled images reconstructed by adding consecutive cardiac phases can be used to provide flow direction in addition to the calibration of flow velocity. For complex differences based on undersampling by a factor of two, temporal resolution of fully sampled images is degraded by a factor of two from those based on complex differences.

Partial field of view flow acquisition and reconstruction also tends to reduce or eliminate other undesirable signal degradations. For example, off-resonance effects tend to produce image blurring with spiral k-space scanning. Off-resonance contributions are substantially unchanged with application of bipolar encoding, and are eliminated or compensated in the same manner as background phase in the partial field of view reconstruction.

PHANTOM AND IN-VIVO IMAGE ACQUISITION EXAMPLES

A spiral phase contrast pulse sequence (spiral k-space scan with a bipolar gradient with a selected first moment difference) was programmed for application to a flow phantom and for in-vivo use. A 1.5 T MR imaging system was used having a maximum gradient of 4 G/cm and a maximum slew rate of 150 G/cm/ms. An 8-channel cardiac phased array coil was used for signal detection. An interleaved spiral sequence was used that includes an initial constant slew-rate portion and a final constant amplitude portion at the peak gradient amplitude with used with a bipolar gradient to form a spiral phase contrast (PC) sequence.

A flow phantom was configured as a 1 cm diameter tube with a constant flow rate. Experiments were performed at flow rates ranging from about 6.28 ml/s to 18.59 ml/s. Imaging parameters were TR=25.42 ms, $V_{enc}$=80 cm/s, $\theta$=30 degrees, slice thickness=3 mm, field of view FOV=40 cm, bandwidth (BW)=±125 kHz with 4096 acquired points and 32 spiral scan interleaves. Water doped with Gd-DTPA at 0.05 nmol/L was used in the flow phantom to simulate the $T_1$ of blood at 1.5 T.

For phantom studies, average through-plane flow velocities were calculated by averaging the velocities in the lumen of the tube. A linear correlation analysis was performed by comparing mean velocities calculated from a full FOV and the partial FOV complex difference technique for 4 different flow rates. Average flow velocities measured from the fully sampled and partial FOV complex difference approach yielded a correlation coefficient r>0.9988, and a slope of 0.9921.

PC MRI as described was also demonstrated on five normal volunteers with no history of cardiac disease. Through plane flow images were acquired in an axial slice superior to the aortic valve with a fully sampled k-space. All studies were breath-held and ECG gated. The imaging parameters were as follow: TR=23.6 ms, $V_{enc}$=150 cm/s, $\theta$=30°, FOV=30 cm×30 cm, BW=±125 kHz, slice thickness=6 mm. A total of 16 spiral interleaves with an image matrix of 256×256 was used to sample k-space. A single interleaf per segment was used to achieve a temporal resolution of 23.6 ms.

Statistical analysis was performed using flow velocity measurements from a region of interest (ROI) within the ascending aorta. Spatial correlation coefficients (SCC) between the voxels within the ROI reconstructed from a fully sampled measure spin velocity $V_{fs}$ and a partially sampled measured spin velocity $V_{ps}$ were calculated for each cardiac phase according to:

$$SCC_{cardiac\ phase} = \frac{\sum_{(x,y)} V_{fs}(x,y) \times V_{ps}(x,y)}{\sqrt{\sum_{(x,y)} V_{fs}^2(x,y) \sum_{(x,y)} V_{ps}^2(x,y)}}.$$

This measurement shows the correlation coefficient over multiple voxels in the ROI for different velocities in the cardiac cycle. Furthermore, signal to noise measurement analysis was performed using the non-calibrated complex difference reconstruction data to quantify signal to noise loss using pFOV reconstruction. The mean signal from a region of interest in the ascending aorta and the standard deviation of the noise outside the vessels was measured.

FIGS. 6A-7D are images associated with reconstruction of a partial FOV acquisition. FIGS. 6A-6D are magnitude images of the four coil elements that show significant aliasing artifacts, and FIGS. 7A-7D are complex difference images obtained with the same four coil elements. Significant aliasing artifacts (indicated with arrows) are apparent in the anatomical images resulting from static spins in the imaging field of view (see FIGS. 6A-6D). However, these artifacts are completely suppressed in the complex difference images of FIGS. 7A-7D, permitting accurate flow measurements.

FIGS. 8A-10D show conventional phase difference reconstruction for a fully sampled image (FIGS. 8A-8D) and a partial FOV (FIGS. 9A-9D). The bottom row (FIGS. 10A-10D) shows the error difference between the two reconstructions. The results show significant aliasing artifacts in the flow images (shown by arrows), which can cause significant errors in flow quantifications.

FIGS. 11A-13D show complex difference images reconstructed from a fully-sampled acquisition (FIGS. 11A-1D), a partial FOV (FIGS. 12A-12D) and the image difference (FIGS. 13A-13D). There are no aliasing artifacts apparent in the partial FOV reconstructed with the complex difference as shown in the image difference. There is an increase in the noise level. The complex difference images shown are not calibrated to quantify flow for more convenient visualization of artifacts.

FIGS. 14A-14D illustrate a comparison of the anatomical and corresponding quantitative flow images reconstructed using complex difference processing for a fully sampled FOV (FIGS. 14A-14B) and a partial FOV (FIGS. 14C-14D). The flow images are calibrated and quantitative flow maps are shown. The arrow in the image shows the aliasing artifact caused by the half k-space sampling pattern that would obscure the signal in the target vessel, the ascending aorta.

FIGS. 15A-15B show a quantitative analysis of blood flow within an ROI in the ascending aorta over a cardiac cycle. The two velocity curve in FIG. 15A shows the mean blood flow velocity measured from the velocity map reconstructed with complex difference processing using full and partial k-space acquisitions. The results show good correlation between velocities calculated from both techniques. FIG. 15B shows the spatial correlation curve calculated from an ROI within the ascending aorta over one cardiac cycle. This shows that even in low velocity flow, there is still good correlation between the velocities calculated in the ROI by the two techniques. An average SCC of 0.91 was achieved over one cardiac cycle averaged over all 8 coil elements. The inset of FIG. 15B is an anatomical image of the region in which the flow measurements were obtained. A signal-to-noise analysis shows a 30% SNR decrease in the partial FOV acquisition compared to a fully sampled acquisition, which is a direct consequence of undersampling in k-space.

Phantom and in-vivo studies show that the acquisition time of a spiral phase contrast image can be reduced by a factor of two using complex difference processing while maintaining accuracy of the measured velocity and flow values. The advantage of the complex-difference processing over conventional phase difference is an effective reduction in the object size by eliminating signals from static tissue, thus eliminating aliasing. In the examples described above, a partial FOV of one-half a full FOV was used and scan time was proportionately reduced, but smaller or larger reductions in FOV can be used to obtain a selected temporal resolution and scan time. In such examples, a partial FOV is configured to contain substantially all moving spins.

While the disclosed technology is described with respect to particular applications and in specific examples, it will be apparent that the disclosed examples can be modified in arrangement and detail, and we claim all that is encompassed by the appended claims.

What is claimed is:

1. A magnetic resonance imaging method, comprising:
selecting a portion of a field of view that is less than about half of a full field of view;
obtaining a first MR signal based on a first undersampled scan with respect to the full field of view and a first moment encoding;
obtaining a second MR signal based on a second undersampled scan with respect to the full field of view and a second first moment encoding;
subtracting the first MR signal and the second MR signal to produce an MR difference signal; and
displaying an image based on the MR difference signal, wherein an image portion associated with the portion of the field of view is substantially free of aliasing contributions from moving spins in the full field of view.

2. The method of claim 1, wherein the first MR signal, the second MR signal, and the MR difference signal are image signals.

3. The method of claim 2, further comprising determining a velocity of spins in at least a portion of the image associated with the MR difference signal.

4. The method of claim 3, wherein the velocity is established based on a calibration using a fully sampled MR image.

5. The method of claim 2, wherein the first and second undersampled scans are spiral scans selected so that the first and second MR signals are aliased.

6. The method of claim 2, further comprising estimating a spin flow rate in the partial field of view based on the MR difference signal.

7. The method of claim 6, where the estimated spin flow rate is associated with cardiac blood flow.

8. The method of claim 1, further comprising selecting the partial field of view to be about one-half a full field of view, wherein the first and second spiral scans undersample the full field of view by a factor of about 2.

9. The method of claim 1, wherein the first and second phase encodings are based on applying a first bipolar gradient and a second bipolar gradient.

10. The method of claim 9, wherein the second bipolar gradient is equal to the first bipolar gradient and is applied with a predetermined delay.

11. A method of visualizing moving spins, comprising:
obtaining first and second phase encoded MR signals that are undersampled with respect to a full field of view;
subtracting the first and second phase-encoded MR signals to obtain a phase contrast difference signal; and
displaying an image of at least a portion of the full field of view based on the phase contrast difference signal, wherein the image of the portion of the full field of view is substantially free of aliasing contributions associated with moving spins in the full field of view.

12. The method of claim 11, further comprising:
identifying portions of the image associated with moving spins; and
estimating a moving spin velocity associated with at least one portion of the image based on the phase contrast difference signal.

13. A magnetic resonance imaging (MRI) method, comprising:
obtaining at least first and second undersampled images that include contributions from moving spins in a field of view; and
forming an image with reduced aliasing in a partial field of view based on a difference of the first and second undersampled images.

14. The MRI method of claim 13, further comprising selecting an undersampling extent based on the selected partial field of view.

15. The method of claim 13, wherein the undersampling extent is a factor of two.

16. A computer readable media containing computer-executable instructions for the method of claim 13.

17. A magnetic resonance imaging (MRI) apparatus, comprising:
a receiver configured to detect at least a first and a second magnetic resonance (MR) signal;
a processor configured to produce an image based on a difference of the first and second MR signals;
a gradient controller configured to phase encode a region of interest and provide a k-space trajectory selected so that the first and second MR signals are undersampled in a field of view; and
a display configured to produce an image of a partial field of view based on the difference of the first and second MR signals, wherein the image is substantially free of aliasing associated with moving spins.

18. The MRI apparatus of claim 17, wherein the controller is configured to receive an input value associated with a size of the partial field of view.

19. The MRI apparatus of claim 17, wherein the controller is configured to receive an input associated with an undersampling extent.

20. The MRI apparatus of claim 17, wherein the gradient controller is configured to produce interleaved spiral k-space scans, wherein the first and second MR signals are associated with a selected spiral k-space scan.

21. A magnetic resonance (MR) signal processor, comprising:
an input configured to receive a first MR signal and a second MR signal, wherein the first and second MR signals are undersampled phase contrast signals in a field of view; and
a signal subtractor configured to obtain a difference signal based on a difference of the first and second MR signals, wherein the difference signal is associated with an image of at least a portion of the field of view in which aliasing associated with the first undersampled MR signal and the second undersampled MR signal is reduced.

22. The MR signal processor of claim 21, further comprising an output configured to couple the difference signal to an image display.

23. The MR signal processor of claim 21, further comprising an output configured to indicate a spin velocity associated with at least a portion of the displayed image.

* * * * *